(12) United States Patent
An et al.

(10) Patent No.: US 12,232,303 B2
(45) Date of Patent: Feb. 18, 2025

(54) POWER CONVERSION DEVICE

(71) Applicant: LG INNOTEK CO., LTD., Seoul (KR)

(72) Inventors: Sang Hun An, Seoul (KR); Ju Young Jang, Seoul (KR); Seok Min Jin, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 202 days.

(21) Appl. No.: 18/019,698

(22) PCT Filed: Aug. 5, 2021

(86) PCT No.: PCT/KR2021/010355
§ 371 (c)(1),
(2) Date: Feb. 3, 2023

(87) PCT Pub. No.: WO2022/031083
PCT Pub. Date: Feb. 10, 2022

(65) Prior Publication Data
US 2023/0276603 A1    Aug. 31, 2023

(30) Foreign Application Priority Data

Aug. 5, 2020    (KR) .................. 10-2020-0097953

(51) Int. Cl.
*H05K 7/20* (2006.01)
*H02M 7/00* (2006.01)

(52) U.S. Cl.
CPC ........ *H05K 7/20909* (2013.01); *H02M 7/003* (2013.01); *H05K 7/20154* (2013.01)

(58) Field of Classification Search
CPC ... G06F 1/20; G06F 1/203; G06F 1/16; G06F 1/183; G06F 1/181; G06F 2200/201;
(Continued)

(56) References Cited

U.S. PATENT DOCUMENTS 6,301,115 B1 * 10/2001 Hashimoto ............... G06F 1/20
174/16.3
6,384,325 B1 * 5/2002 Chastain ............. H05K 9/0041
174/383

(Continued)

FOREIGN PATENT DOCUMENTS

KR        10-0455562 B1    11/2004
KR        10-0663139 B1     1/2007
(Continued)

*Primary Examiner* — Mandeep S Buttar
(74) *Attorney, Agent, or Firm* — Birch, Stewart, Kolasch & Birch, LLP

(57) ABSTRACT

A power conversion device comprises: a housing having a space formed therein and including a first opening and a second opening; a fan coupled to the second opening and allowing air to flow in a first direction from the first opening toward the second opening; a first electronic component arranged in the space; a heat dissipation member arranged at the rear of the first electronic component with respect to a flow direction of air; a printed circuit board arranged on the heat dissipation member; and a second electronic component arranged under the printed circuit board to be in contact with the upper surface of the heat dissipation member.

20 Claims, 17 Drawing Sheets

(58) Field of Classification Search
CPC ........... H05K 7/20409; H05K 7/20727; H05K 9/0041; H05K 7/20172; H05K 7/20436; H05K 7/20136; H05K 7/2039; H05K 7/20909; H05K 9/0007; H01L 23/467
USPC .......... 361/697, 679.54, 688, 703, 709, 694; 165/80.3, 80.2; 257/722, 719, 713, 712
See application file for complete search history.

(56) References Cited

U.S. PATENT DOCUMENTS

| | | | | |
|---|---|---|---|---|
| 2003/0218850 | A1* | 11/2003 | Kubo | H01L 23/467 |
| | | | | 361/103 |
| 2010/0002373 | A1* | 1/2010 | Guo | G06F 1/20 |
| | | | | 361/679.54 |
| 2012/0281360 | A1* | 11/2012 | Nicol | G16H 20/13 |
| | | | | 29/825 |
| 2015/0049436 | A1* | 2/2015 | Wu | H05K 7/20163 |
| | | | | 361/697 |
| 2015/0156919 | A1* | 6/2015 | Schroedl | H05K 7/209 |
| | | | | 361/692 |
| 2018/0158748 | A1* | 6/2018 | Kwon | H05K 7/2089 |
| 2019/0320555 | A1* | 10/2019 | Flavin | H05K 7/20409 |
| 2020/0120830 | A1 | 4/2020 | Song | |
| 2020/0133357 | A1* | 4/2020 | Zhai | H05K 7/2039 |
| 2022/0293487 | A1* | 9/2022 | Teranishi | H05K 7/20409 |
| 2023/0328937 | A1* | 10/2023 | An | H02M 7/00 |
| | | | | 361/695 |
| 2024/0042952 | A1* | 2/2024 | Fukuchi | B60L 53/302 |

FOREIGN PATENT DOCUMENTS

| | | |
|---|---|---|
| KR | 10-1036212 B1 | 5/2011 |
| KR | 10-1896569 B1 | 9/2018 |

* cited by examiner

| Number of fans | Number of heat dissipation members | Shape of heat dissipation member | Arrangement plan | Maximum component temperature | |
|---|---|---|---|---|---|
| 2 | 2 | Individual type |  | 90.67 | A |
| | | Connected type |  | 88.74 | B |
| | 3 | Individual type |  | 151.7 | C |

| Number of fans | Number of heat dissipation members | Shape of heat dissipation member | Arrangement plan | Maximum component temperature | |
|---|---|---|---|---|---|
| 3 | 3 | Individual type |  | 107.2 | D |
| | | Connected type |  | 90.58 | E |

POWER CONVERSION DEVICE

CROSS REFERENCE TO RELATED APPLICATIONS

This application is the National Phase of PCT International Application No. PCT/KR2021/010355, filed on Aug. 5, 2021, which claims priority under 35 U.S.C. 119 (a) to Patent Application No. 10-2020-0097953, filed in the Republic of Korea on Aug. 5, 2020, all of which are hereby expressly incorporated by reference into the present application.

TECHNICAL FIELD

The present embodiment relates to a power conversion device.

BACKGROUND ART

Recently, countries around the world are making various attempts to replace existing fossil energy resources. First of all, for the use of nature-friendly energy, intensive investment in the renewable energy industry for the use of nature-friendly energy and the energy distribution and storage industry for energy efficiency improvement has been going on, and in Korea, various policies for the energy industry are being planned and underway due to the shutdown of nuclear power plants and power outages following the earthquake in Japan, and looking at this trend of the times, demand for new and renewable energy is increasing, and in line with this, technologies for efficiently managing power, such as smart grids, are also being actively researched.

The problem of using energy efficiently leads to an analysis of demand patterns such as the place and time of users who use energy, and the core concept of smart grid is how to distribute the produced energy in consideration of the user's demand patterns. Therefore, in order to store the produced energy in a certain time or space and supply it according to the usage pattern of the consumer, a storage device in which the produced energy can be stored, that is, a battery, is required, and the concept of expanding these batteries is called an energy storage system (ESS).

An energy storage system (ESS) is an energy storage system that controls various voltages and currents generated from distributed power or renewable energy to connect to a power system as needed or to store and use idle energy. The power conversion system (PCS) is a system that converts characteristics of electricity, that is, AC/DC, voltage, frequency, and the like to receive power from a power source inside the energy storage system (ESS) and store it in a battery or discharge it to the grid.

As an example of a power conversion device, a DC-DC converter refers to an electronic circuit device that converts DC power of a certain voltage to DC power of another voltage, and it is used in various fields such as television receivers, automotive electronic parts, and energy storage systems (ESS).

The outer shape of the power conversion apparatus is formed by the housing, and a number of electronic components for driving are disposed inside the housing. The plurality of electronic components generates heat by being driven. Since the generated heat affects the operation of electronic components, a heat dissipation means in the housing is an essential factor to be considered. However, considering the narrow space inside the housing, it is difficult to arrange the heat dissipation means and electronic components.

DETAILED DESCRIPTION OF THE INVENTION

Technical Subject

The present embodiment is to provide a power conversion device capable of improving heat dissipation efficiency by improving the structure.

Technical Solution

A power conversion device according to present embodiment comprises: a housing having a space formed therein and including a first opening and a second opening; a fan being coupled to the second opening and allowing air to flow in a first direction from the first opening toward the second opening; a first electronic component being disposed in the space; a heat dissipation member being disposed between the first electronic component and the fan; a printed circuit board being disposed at an upper portion of the heat dissipation member; and a second electronic component being disposed at a lower portion of the printed circuit board to be in contact with an upper surface of the heat dissipation member.

The first electronic component is provided in plurality and disposed to be spaced apart from each other along a second direction perpendicular to the first direction, and the heat dissipation member may be provided in plurality and disposed to be spaced apart from each other along the second direction.

Each of the plurality of heat dissipation members may be disposed to be overlapped with a region between the plurality of first electronic components in the first direction.

The first electronic component includes: a first-first electronic component and a first-second electronic component being spaced apart from each other with respect to a first space portion; and a first-third electronic component being spaced apart through the first-first electronic component and a second space portion, wherein the heat dissipation member may include: a first heat dissipation member being disposed to be overlapped with the first space portion in the first direction; and a second heat dissipation member being disposed to be overlapped with the second space portion in the first direction.

The fan may include a first fan being disposed to be overlapped with the first heat dissipation member in a first direction, and a second fan being disposed to be overlapped with the second heat dissipation member in a first direction.

The heat dissipation member may include a plurality of fins, and a flow path through which air flows may be formed between the plurality of fins.

A heat dissipation plate being disposed on the plurality of heat dissipation members is included, and the second electronic component may be provided in plural and being disposed to be spaced apart along the second direction on the heat dissipation plate. The plurality of heat dissipation members may be disposed to be overlapped with the plurality of first electronic components in a first direction.

The plurality of heat dissipation members and the number of the plurality of first electronic components correspond to each other, the fan is provided in plurality, and the number of the plurality of fans may correspond to the number of the plurality of heat dissipation members.

A power conversion device according to another embodiment comprises: a housing having a space formed therein and including a first opening and a second opening; a fan being coupled to the second opening and allowing air to flow in a first direction from the first opening toward the second opening; a plurality of first electronic components being disposed in the space; a heat dissipation member being disposed between the plurality of first electronic components; a printed circuit board being disposed at an upper portion of the heat dissipation member and the first electronic components; and a second electronic component being disposed at a lower portion of the printed circuit board to be in contact with an upper surface of the heat dissipation member, wherein the first electronic component and the heat dissipation member are disposed to be overlapped with each other in a second direction perpendicular to the first direction.

Advantageous Effects

According to the present invention, air flow loss due to the arrangement of the heat dissipation member and the first electronic component is prevented to accomplish air flow smoothly so there is an advantage that the heat dissipation efficiency can be maximized.

BEST MODE

Hereinafter, preferred embodiments of the present invention will be described in detail with reference to the accompanying drawings.

However, the technical idea of the present invention is not limited to some embodiments to be described, but may be implemented in various forms, and within the scope of the technical idea of the present invention, one or more of the constituent elements may be selectively combined or substituted between embodiments.

In addition, the terms (including technical and scientific terms) used in the embodiments of the present invention, unless explicitly defined and described, can be interpreted as a meaning that can be generally understood by a person skilled in the art, and commonly used terms such as terms defined in the dictionary may be interpreted in consideration of the meaning of the context of the related technology.

In addition, terms used in the present specification are for describing embodiments and are not intended to limit the present invention. In the present specification, the singular form may include the plural form unless specifically stated in the phrase, and when described as "at least one (or more than one) of A and B and C", it may include one or more of all combinations that can be combined with A, B, and C.

In addition, in describing the components of the embodiment of the present invention, terms such as first, second, A, B, (a), and (b) may be used.

These terms are merely intended to distinguish the components from other components, and the terms do not limit the nature, order or sequence of the components.

And, when a component is described as being 'connected', 'coupled' or 'interconnected' to another component, the component is not only directly connected, coupled or interconnected to the other component, but may also include cases of being 'connected', 'coupled', or 'interconnected' due that another component between that other components.

In addition, when described as being formed or arranged in "on (above)" or "below (under)" of each component, "on (above)" or "below (under)" means that it includes not only the case where the two components are directly in contact with, but also the case where one or more other components are formed or arranged between the two components. In addition, when expressed as "on (above)" or "below (under)", the meaning of not only an upward direction but also a downward direction based on one component may be included.

A power conversion device according to present embodiment may be a DC-DC converter. However, the configuration according to the present embodiment is not limited thereto, and the heat dissipation structure according to the present embodiment may be applied inside various electronic devices.

Figure 1:
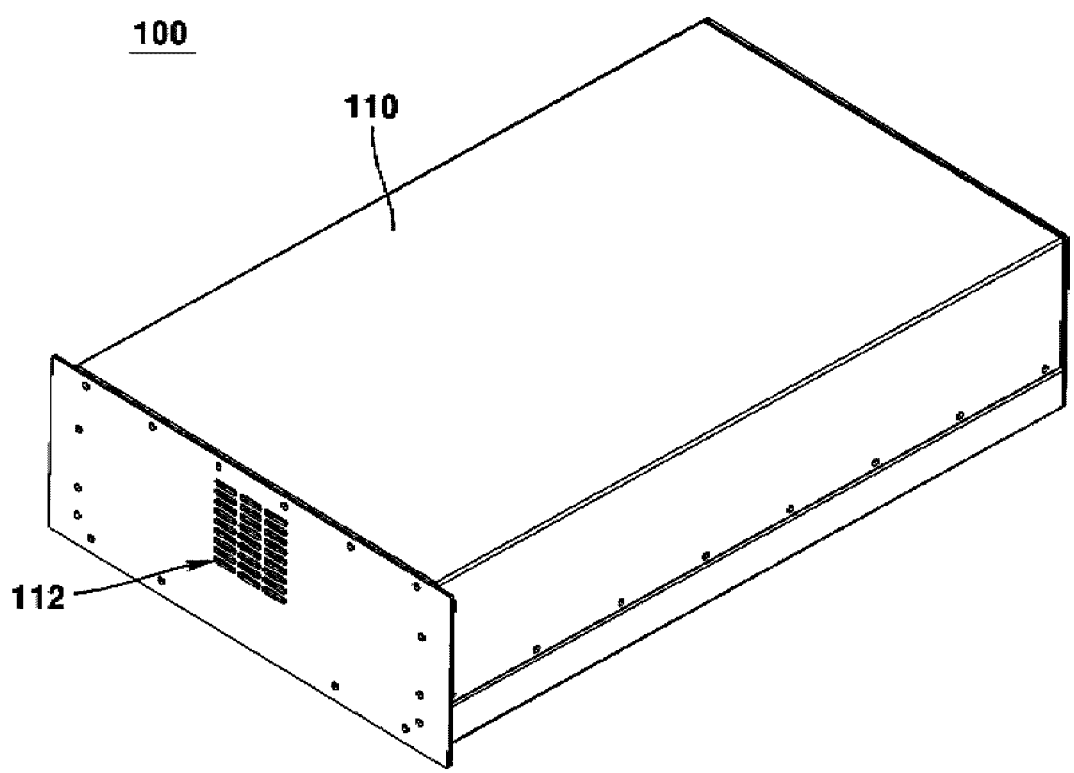
FIG. 1 is a perspective view illustrating the outer appearance of a power conversion device according to a first embodiment of the present invention.
Figure 2:
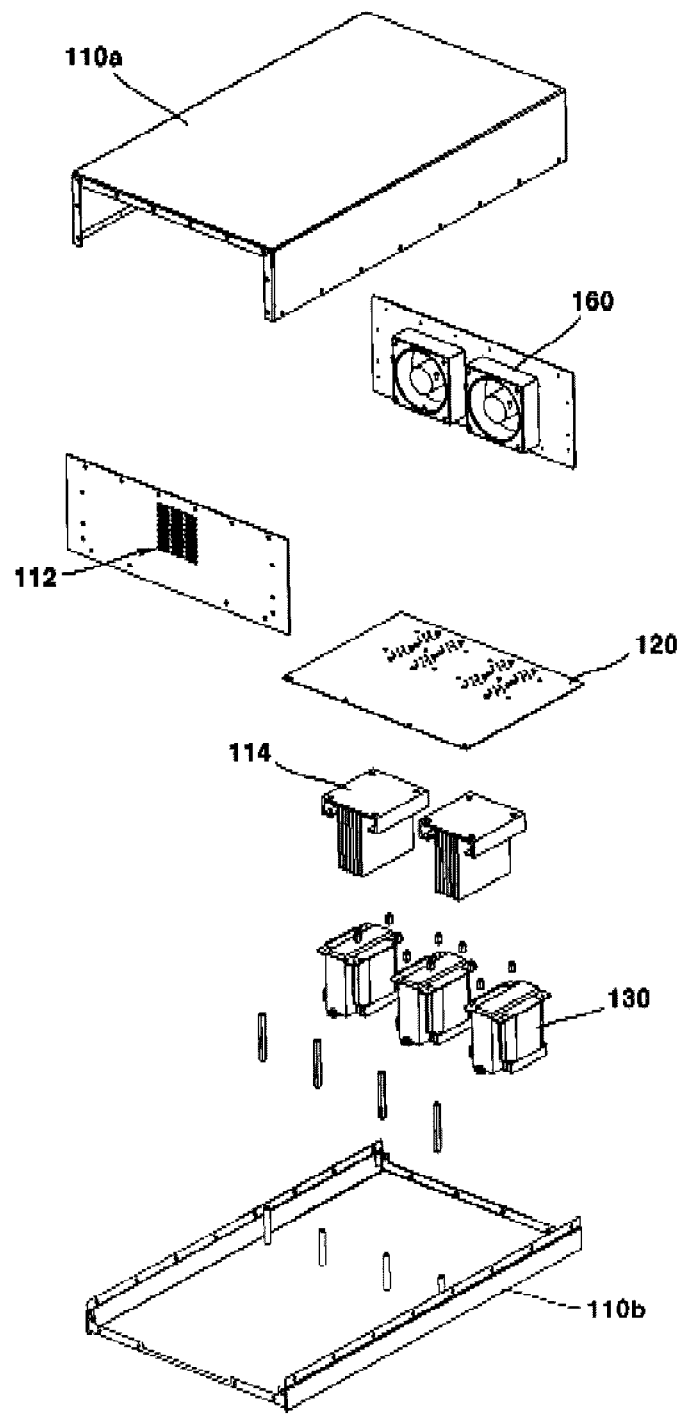
FIG. 2 is an exploded perspective view of a power conversion device according to a first embodiment of the present invention.
Figure 3:
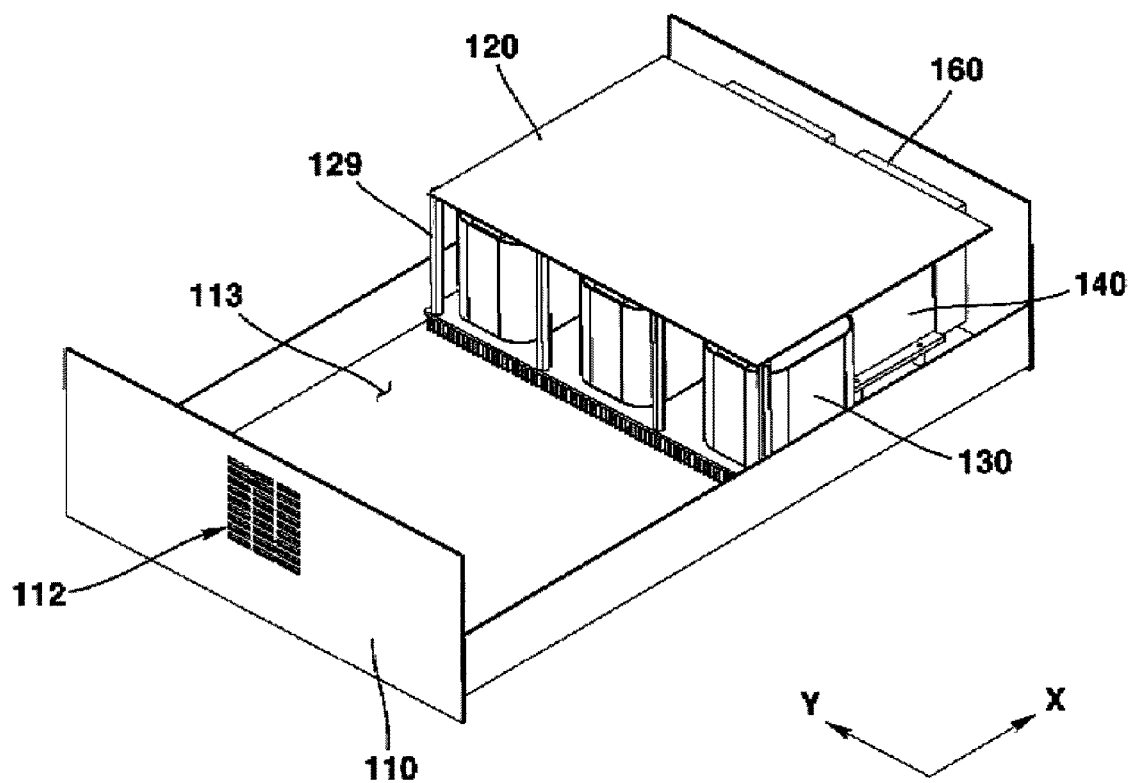
FIG. 3 is a perspective view illustrating a space inside a power conversion device according to a first embodiment of the present invention.
Figure 4:
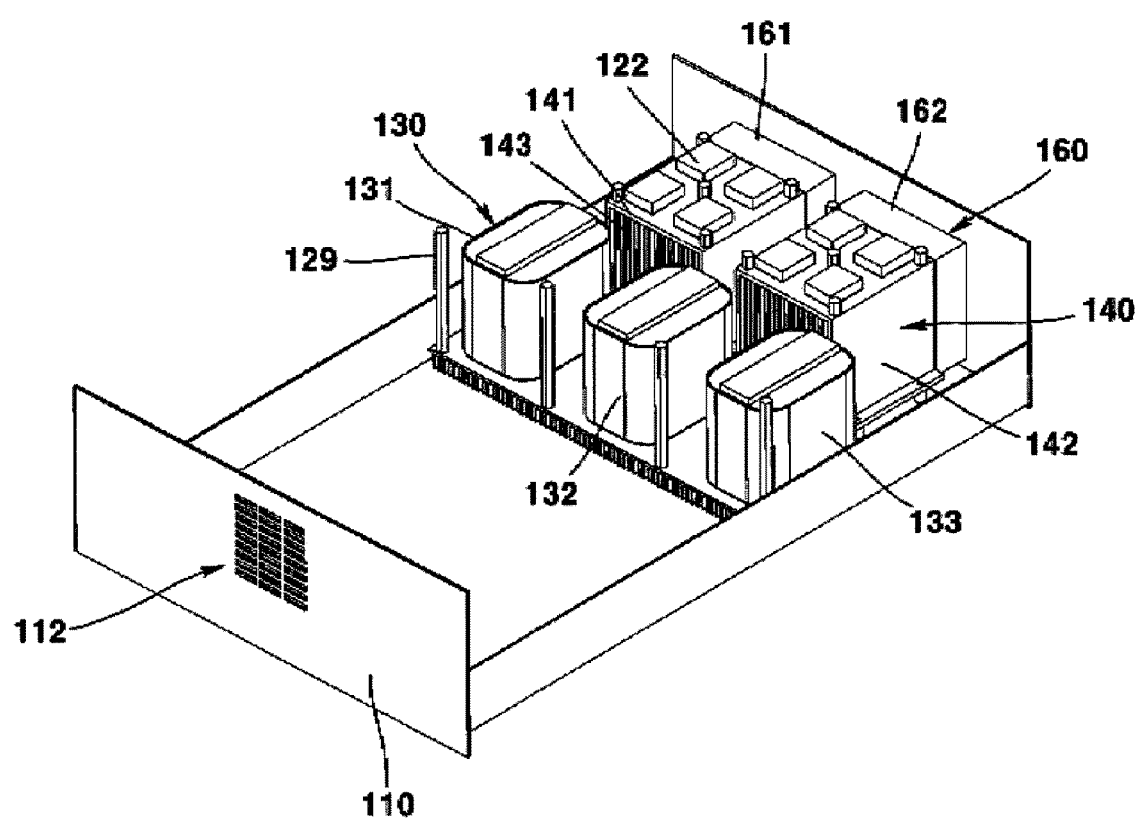
FIG. 4 is a perspective view of FIG. 3 excluding the printed circuit board.
Figure 5:
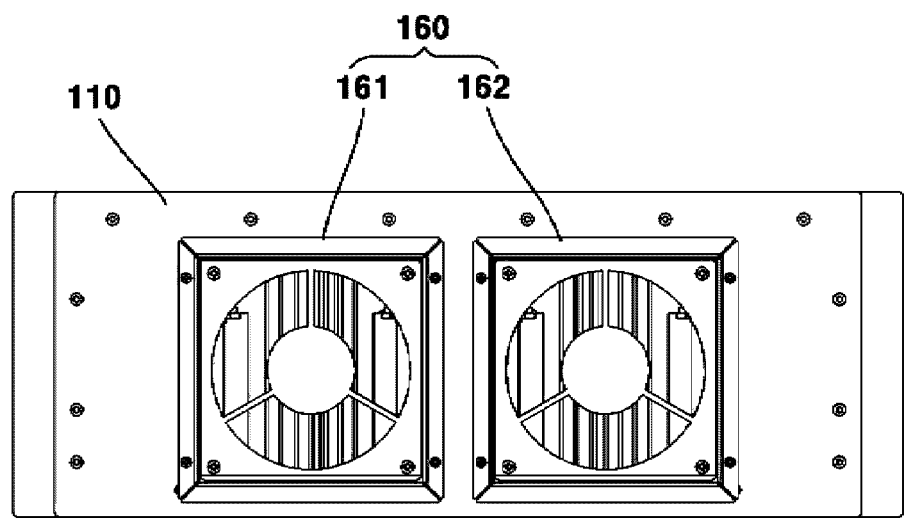
FIG. 5 is a plan view illustrating a state in which a fan is disposed inside a housing according to a first embodiment of the present invention.
Figure 6:
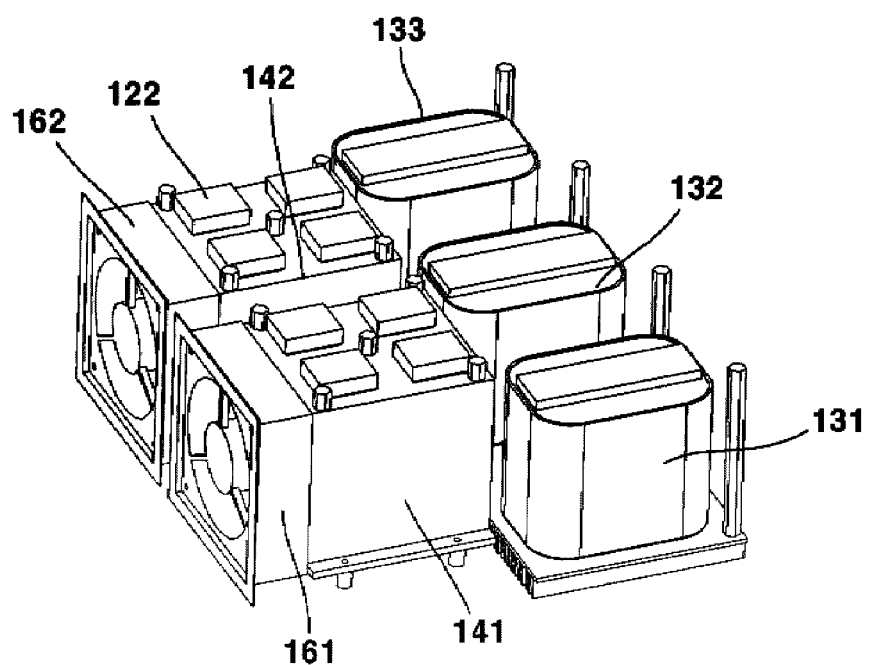
FIG. 6 is a perspective view of a heat dissipation structure according to a first embodiment of the present invention.
Figure 7:
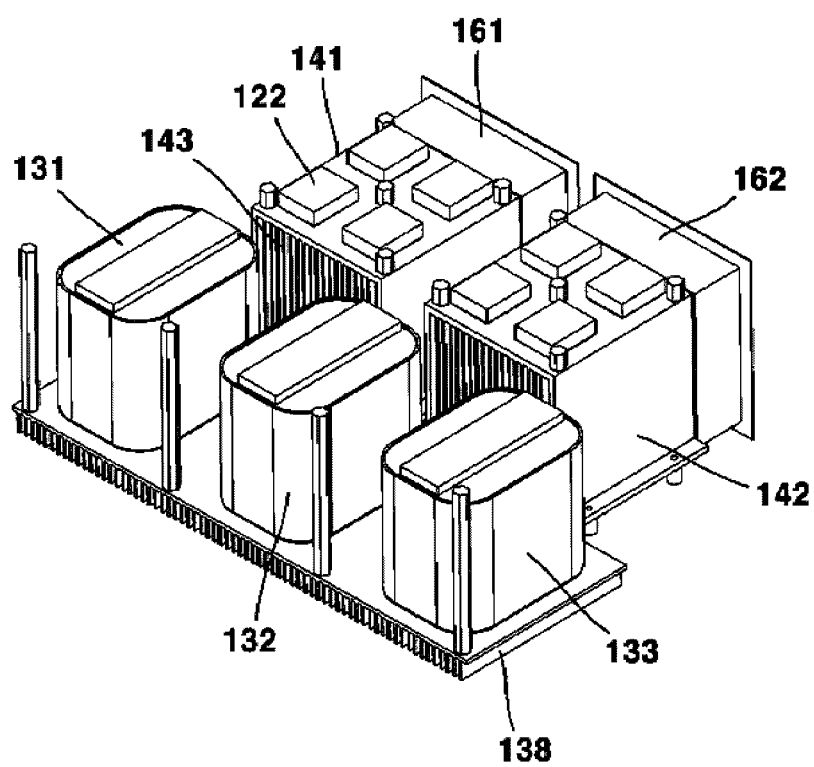
FIG. 7 is a perspective view of FIG. 6 from another angle.
Figure 8:
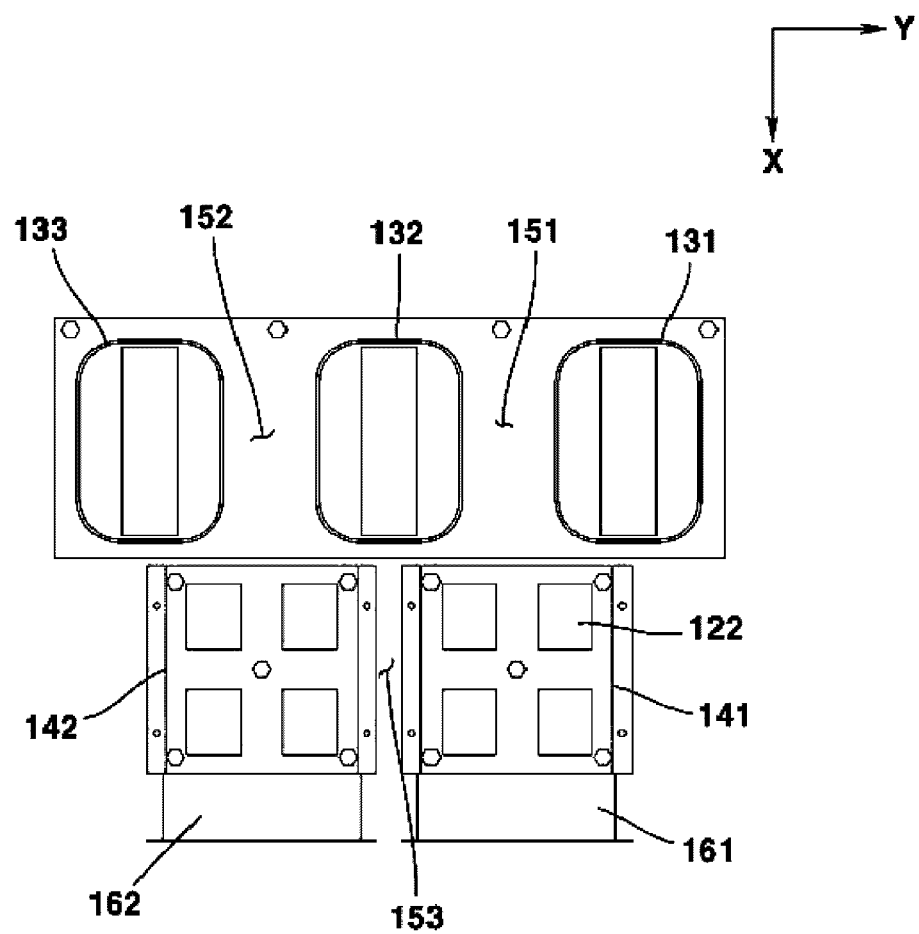
FIG. 8 is a plan view of a heat dissipation structure according to a first embodiment of the present invention viewed from above.

FIG. 1 is a perspective view illustrating the outer appearance of a power conversion device according to a first embodiment of the present invention; FIG. 2 is an exploded perspective view of a power conversion device according to a first embodiment of the present invention; FIG. 3 is a perspective view illustrating a space inside a power conversion device according to a first embodiment of the present invention; FIG. 4 is a perspective view of FIG. 3 excluding the printed circuit board; FIG. 5 is a plan view illustrating a state in which a fan is disposed inside a housing according to a first embodiment of the present invention; FIG. 6 is a perspective view of a heat dissipation structure according to a first embodiment of the present invention; FIG. 7 is a perspective view of FIG. 6 from another angle; and FIG. 8 is a plan view of a heat dissipation structure according to a first embodiment of the present invention viewed from above.

Referring to FIGS. 1 to 8, the outer shape of the power conversion device 100 according to a first embodiment of the present invention may be formed by the housing 110. The housing 110 may have a rectangular parallelepiped or regular hexahedron shape. A plurality of electronic components for driving the power conversion device 100 may be disposed inside the housing 110. To this end, a space 113 in which the plurality of electronic components are disposed may be formed inside the housing 110.

A first opening 112 may be formed on one side surface of the housing 110. Outside air may be sucked in through the first opening 112. The first opening 112 may include a plurality of through holes. A mesh network having a plurality of through holes may be disposed in the first opening 112.

A second opening (not shown) may be formed on the other side surface facing one side surface of the housing 110. A fan 160 to be described later may be disposed in the second opening. The air sucked into the first opening 112 through the fan 160 flows through the space 113 and may be discharged to the outside through the fan 160.

A plurality of electronic components for driving the power conversion device 100 may be disposed in the space 113 inside the housing 110. The plurality of electronic components may include a printed circuit board 120 and a first electronic component 130. The plurality of electronic components may generate heat by being driven. The plurality of electronic components may be disposed on an air flow path being formed between the first opening 112 and the second opening. Meanwhile, a flow direction of air connecting the first opening 112 and the second opening may be defined as a first direction X.

The first electronic component 130 may be disposed in the space 113. The first electronic component 130 may include an inductor for obtaining inductance and a transformer for voltage conversion. The first electronic component 130 may be provided in plural and disposed to be spaced apart from each other. The plurality of first electronic components 130 may be disposed to be spaced apart from each other along a second direction Y perpendicular to the first direction X.

The plurality of first electronic components 130 may include a first-first electronic component 131, a first-second electronic component 132, and a first-third electronic component 133. A first space portion 151 (see FIG. 8) may be formed between the first-first electronic component 131 and the first-second electronic component 132. A second space portion 152 may be formed between the first-second electronic component 132 and the first-third electronic component 133. The first space portion 151 and the second space portion 152 may be a separation space separating the plurality of first electronic components 130 in the second direction Y.

The plurality of first electronic components 130 may be disposed on the base 138. The base 138 is disposed on the bottom surface of the space 113, and the first electronic component 130 can be placed thereon. A plurality of heat dissipation fins being protruded downward are formed on a lower surface of the base 138 so that the heat generated by the first electronic component 130 can be transmitted to the housing 110.

Meanwhile, the base 138 may be referred to as a second heat dissipation member in that it functions as a heat dissipation member. The base 138 may be formed integrally with the first electronic component 130.

The printed circuit board 120 is formed in a plate shape and may be disposed above the first electronic component 130. The printed circuit board 120 may be disposed on a heat dissipation member 140 to be described later. The printed circuit board 120 may be disposed to be overlapped with the first electronic component 130 and the heat dissipation member 140 in an up and down direction.

A second electronic component 122 may be disposed at a lower portion of the printed circuit board 120. The second electronic component 122 may be mounted on a lower surface of the printed circuit board 120. The second electronic component 122 may include an FET device or a diode. The lower surface of the second electronic component 122 may be in contact with an upper surface of a heat dissipation member 140 to be described later.

Inside the housing 110, the lower end is coupled to a bottom surface of the space 113 or an upper surface of the base 138, so that a support part 129 separating the printed circuit board 120 from the bottom surface of the space 113 or the upper surface of the base 138 may be disposed. An upper end of the support part 129 may be coupled to a lower surface of the printed circuit board 120 so that the lower surface of the printed circuit board 120 can be supported.

A heat dissipation structure of the power conversion device 100 may be formed by a heat dissipation member 140 and a fan 160.

The heat dissipation member 140 may be disposed at a rear direction of the first electronic component 130 with respect to a flow direction of air. That is, the heat dissipation member 140 may be disposed between the first electronic component 130 and the second opening of the housing 110, and more precisely, it may be disposed between the first and second space portions 151 and 152 and the fan 160 in the second direction Y. The heat dissipation member 140 may include a plurality of heat dissipation fins 143. Each of the plurality of heat dissipation fins 143 is formed in an up and down direction so that the surface area of the heat dissipation member 140 can be increased. The plurality of heat dissipation fins 143 is disposed to be spaced apart from each other in the second direction Y, so that a flow path through which air flows can be formed therebetween.

The heat dissipation member 140 may be provided in plurality and disposed to be spaced apart from each other. A plurality of heat dissipation members 140 may be disposed to be spaced apart from each other along the second direction Y. The plurality of heat dissipation members 140 may include a first heat dissipation member 141 and a second heat dissipation member 142. A third space portion 153 may be disposed between the first heat dissipation member 141 and the second heat dissipation member 142. The third space portion 153 may be a separation space separating the first heat dissipation member 141 and the second heat dissipation member 142 in the second direction Y.

A lower surface of the second electronic component 122 may be in contact with an upper surface of the heat dissipation member 140. The second electronic component 122 may be provided in plural and disposed to be spaced apart from each other. For example, on a single heat dissipation member 140, four second electronic components 122 may be disposed to be adjacent to each corner of the heat dissipation member 140.

The fan 160 is coupled to the second opening and sucks air introduced from the first opening 112 and then discharges it to the outside of the housing 110 through the second opening. The fan 160 may flow air inside the space 113 in a first direction X. At least a portion of the fan 160 may be disposed to be protruded inward from an inner surface of the housing 110.

The fan 160 may be provided in plural and disposed to be spaced apart from each other. The plurality of fans 160 may include a first fan 161 and a second fan 162. The first fan 161 and the second fan 162 may be disposed to be spaced apart from each other along the second direction Y.

The fan 160 and the heat dissipation member 140 may be disposed to be spaced apart from each other along the first direction X. Accordingly it is possible to secure a wider air flow space.

The heat dissipation structure inside the power conversion device 100 according to present embodiment is characterized by the arrangement structure of the first electronic component 130, the heat dissipation member 140, and the fan 160.

Specifically, the plurality of heat dissipation members 140 may be disposed to be overlapped with a region between the plurality of first electronic components 130 in a first direction X. The center of each of the plurality of heat dissipation members 140 may be disposed to be overlapped with a region between the plurality of first electronic components 130 in a first direction X. The center of each of the plurality of heat dissipation members 140 may be disposed to be overlapped with the first space portion 151 or the second space portion 152 in a first direction X.

In more detail, the center of the first heat dissipation member 141 may be disposed to be overlapped with a region between the first-first electronic component 131 and the first-second electronic component 132 in a first direction X. The first heat dissipation member 141 may be disposed to be overlapped with the first space portion 151 in a first direction X. The center of the second heat dissipation member 142 may be disposed to be overlapped with a region between the first-second electronic component 132 and the first-third electronic component 133 in a first direction X. The second heat dissipation member 142 may be disposed to be overlapped with the second space portion 152 in the first direction X. The center of the first-second electronic component 132 may be disposed to be overlapped with a region between the first heat dissipation member 141 and the second heat dissipation member 142 in a first direction X. The first-second electronic component 132 may be disposed to be overlapped with the third space portion 153 in a first direction X.

The fan 160 may be disposed to be overlapped with the heat dissipation member 140 in a first direction X. The first fan 161 may be disposed to be overlapped with the first heat dissipation member 141 in a first direction X. The second fan 162 may be disposed to be overlapped with the second heat dissipation member 142 in a first direction X.

According to the above structure, air flow loss due to the arrangement of the heat dissipation member 140 and the first electronic component 130 is prevented to accomplish air flow smoothly so there is an advantage that the heat dissipation efficiency can be maximized.

Figure 9:
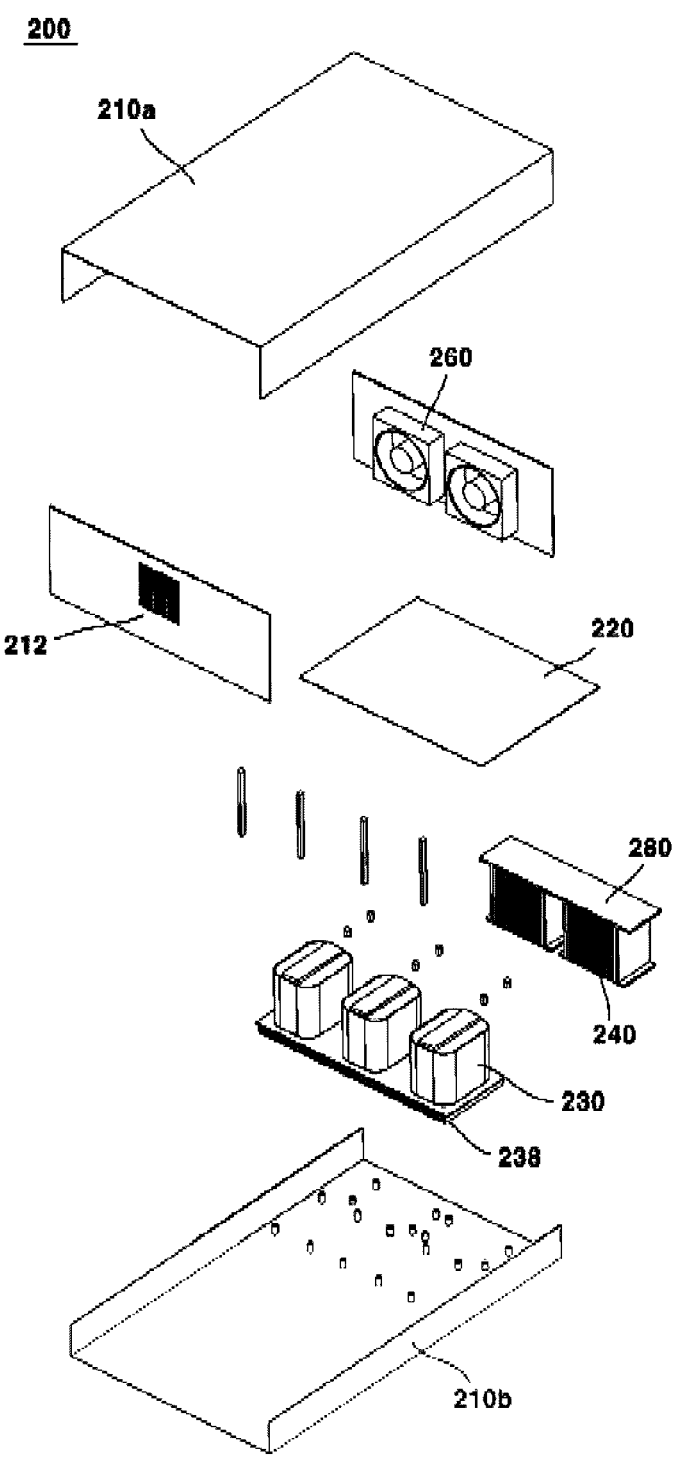
FIG. 9 is an exploded perspective view of a power conversion device according to a second embodiment of the present invention.
Figure 10:
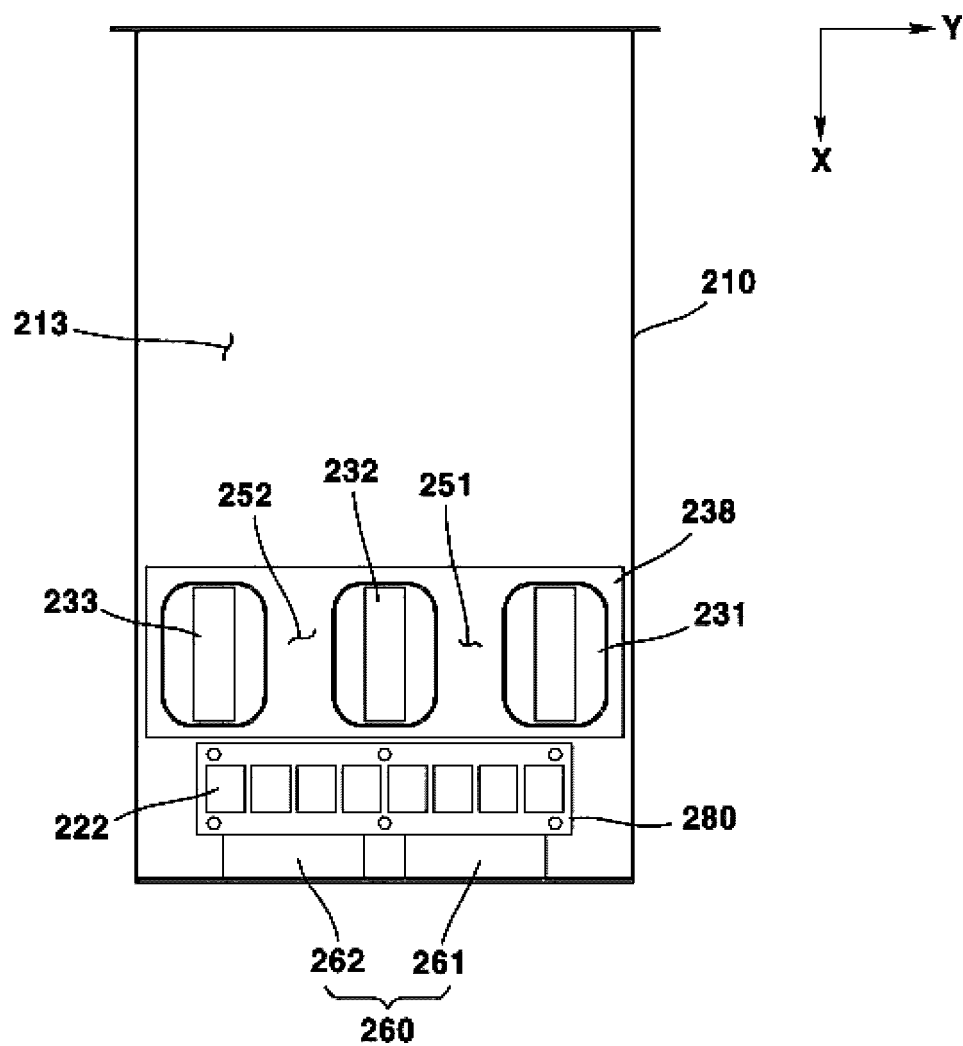
FIG. 10 is a plan view of a heat dissipation structure according to a second embodiment of the present invention viewed from above.

FIG. 9 is an exploded perspective view of a power conversion device according to a second embodiment of the present invention; FIG. 10 is a plan view of a heat dissipation structure according to a second embodiment of the present invention viewed from above; and FIG. 11 is a perspective view of a heat dissipation structure according to a second embodiment of the present invention.

The present embodiment is the same as the first embodiment in other parts, but there is a difference in the coupling of the heat dissipation member and the second electronic component. Hereinafter, only the characteristic parts of the present embodiment will be described, and for the remaining parts, the description of the first embodiment will be used.

Figure 11:
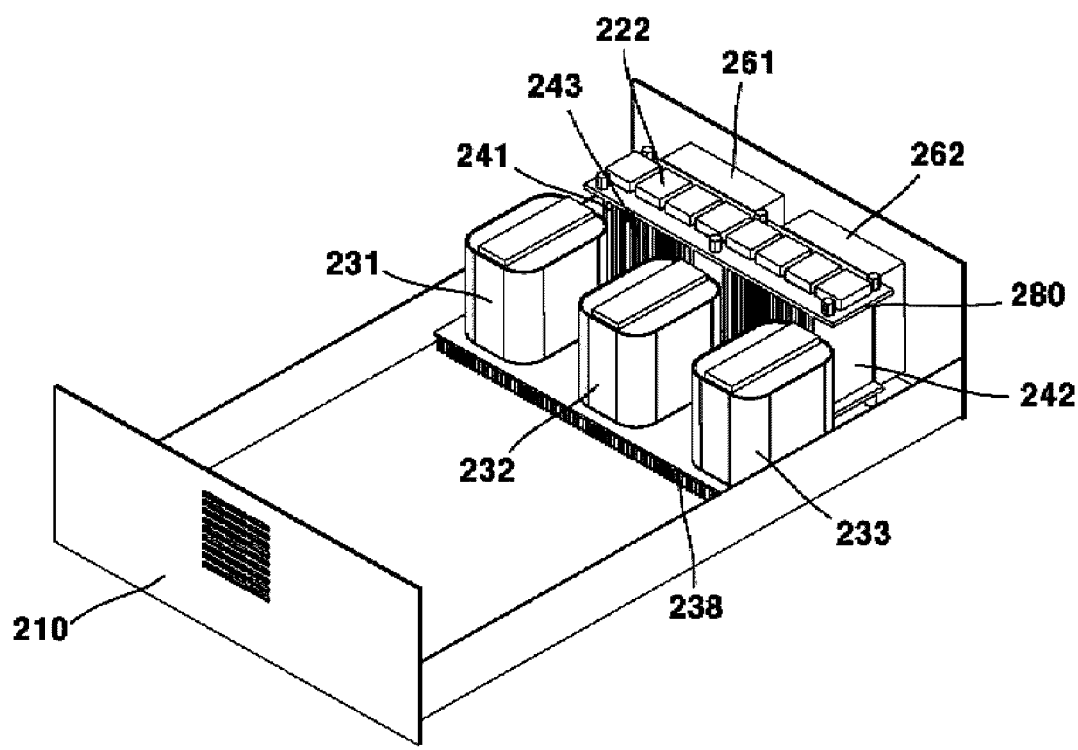
FIG. 11 is a perspective view of a heat dissipation structure according to a second embodiment of the present invention.

Referring to FIGS. 9 to 11, the power conversion device 200 according to the present embodiment may include: a first electronic component 230; a second electronic component 222 being disposed on a lower surface of the printed circuit board 220; and a heat dissipation member 240.

In the present embodiment, a heat dissipation plate 280 may be additionally disposed in addition to the power conversion device 100 according to the first embodiment.

The heat dissipation plate 280 may be disposed on the heat dissipation member 240. The heat dissipation plate 280 may be formed in a plate shape and disposed to connect a plurality of heat dissipation members 241 and 242. The first heat dissipation member 241 and the second heat dissipation member 242 may be connected to each other by the heat dissipation plate 280. The length of the heat dissipation plate 280 in a second direction Y may be longer than the sum of the lengths of the first heat dissipation member 241 and the second heat dissipation member 241 in a second direction Y. The length of the heat dissipation plate 280 in a second direction Y may be shorter than the sum of the lengths of the first-first to first-third electronic components 231, 232, and 233 in a second direction Y.

The heat dissipation plate 280 may be formed of a metal material.

The second electronic component 222 may be disposed on the heat dissipation plate 280. The second electronic component 222 may be provided in plurality and may be disposed to be spaced apart from each other along a second direction Y on the heat dissipation plate 280.

According to the structure as described above, a wider arrangement space of the second electronic component 222 can be secured through the heat dissipation plate 280, and unlike the first embodiment, since some of the heat from the second electronic component 222 is discharged to a lower surface of a portion of the heat dissipation plate 280 being disposed between the first heat dissipation member 241 and the second heat dissipation member 242, there is an advantage that heat dissipation efficiency can be improved. In addition, since the second electronic component 222 can be disposed in a line through the heat dissipation plate 280, it has the advantage of being able to design freely from space constraints.

Figure 12:
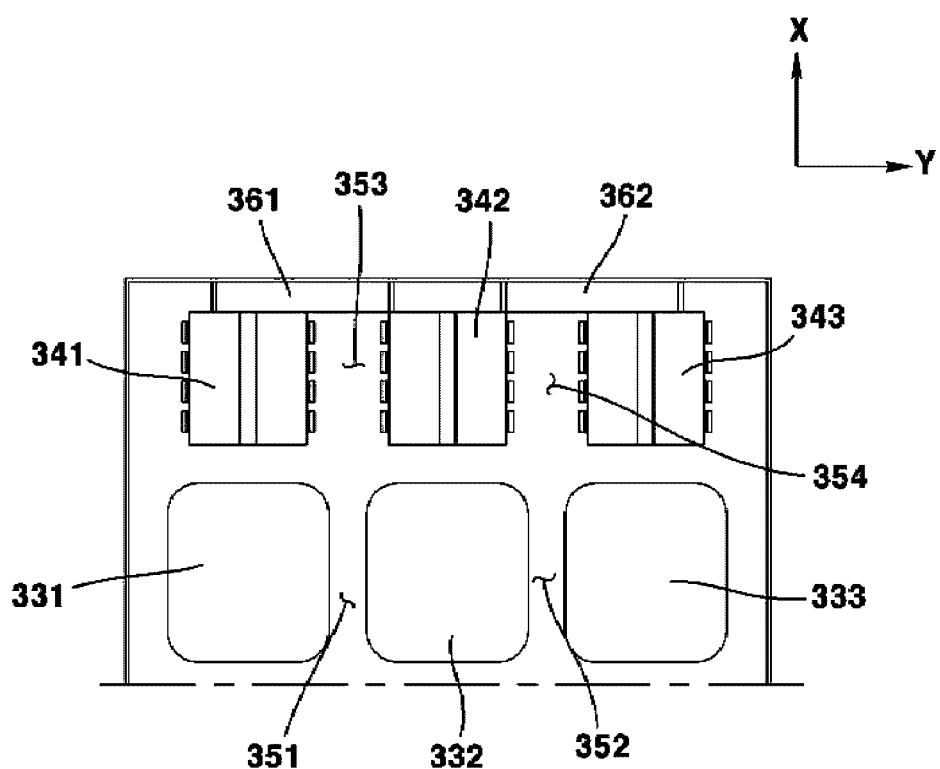
FIG. 12 is a plan view of a heat dissipation structure inside a power conversion device according to a third embodiment of the present invention viewed from above.

FIG. 12 is a plan view of a heat dissipation structure inside a power conversion device according to a third embodiment of the present invention viewed from above.

The present embodiment is the same as the first embodiment in other parts, but there is a difference in the number of the heat dissipation members. Hereinafter, only the characteristic parts of the present embodiment will be described, and for the remaining parts, the description of the first embodiment will be used.

Referring to FIG. 12, the power conversion device according to the present embodiment may include: a plurality of heat dissipation members 341, 342, and 343; a plurality of first electronic components 331, 332, and 334; and fans 361 and 362.

In the present embodiment, it may be disposed in a way that the number of heat dissipation members 340 and the first electronic component 330 is to be the same. For example, the heat dissipation member 340 includes a first heat dissipation member 341, a second heat dissipation member 342, and a third heat dissipation member 343, and the first electronic component 330 may include a first-first electronic component 331, a first-second electronic component 332, and a first-third electronic component 333.

The first to third heat dissipation members 341, 342, and 343 may be spaced apart from each other along a second direction Y. A third space portion 353 is formed between the first heat dissipation member 341 and the second heat dissipation member 342, and a fourth space portion 354 may be formed between the second heat dissipation member 342 and the third heat dissipation member 343.

The first-first to first-third electronic components 331, 332, and 333 may be disposed to be spaced apart from each other along a second direction Y. A first space portion 351 is formed between the first-first electronic component 331 and the first-second electronic component 332, and a second space portion 352 may be formed between the first-second electronic component 332 and the first-third electronic component 333.

The first heat dissipation member 341 may be disposed to be overlapped with the first-first electronic component 331 along a first direction X. The second heat dissipation member 342 may be disposed to be overlapped with the first-second electronic component 332 along a first direction X. The third heat dissipation member 343 may be disposed to be overlapped with the first-third electronic component 333 along a first direction X. The first space portion 351 may be disposed to be overlapped with the third space portion 353 along a first direction X. The second space portion 352 may be disposed to be overlapped with the fourth space portion 354 along a first direction X. In this case, since the air passing through the first space portion 351 and the second space portion 352 passes through the third space portion 353 and the fourth space portion 354 rather than passing through the inside of the heat dissipation member 340, the effect on heat dissipation may be worse than that of the first and second embodiments.

Through the structure as described above, a flow path of air between the electronic component and the heat dissipation member may be secured.

Figure 13:
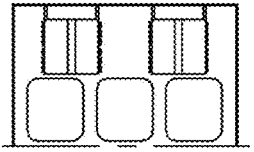
FIG. 13 is a table comparing temperatures of electronic components by heat dissipation structures according to first to third embodiments.
Figure 13:
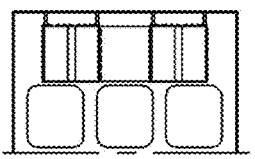
Figure 13:
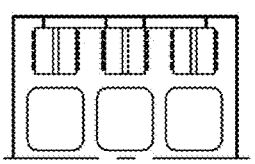

FIG. 13 is a table comparing temperatures of electronic components by heat dissipation structures according to first to third embodiments.

Referring to FIG. 13, when the heat dissipation member according to the first and second embodiments is disposed to be overlapped with a region between a plurality of first electronic components, it can be confirmed that the heat dissipation performance is better than when the heat dissipation member according to the third embodiment is disposed to be overlapped with the first electronic component.

In addition, it can be seen that the heat dissipation performance is slightly better in the case when a plurality of heat dissipation members are interconnected through a heat dissipation plate (second embodiment) than in the case of disposing the second electronic component by separating each heat dissipation member (first embodiment).

Figure 14:
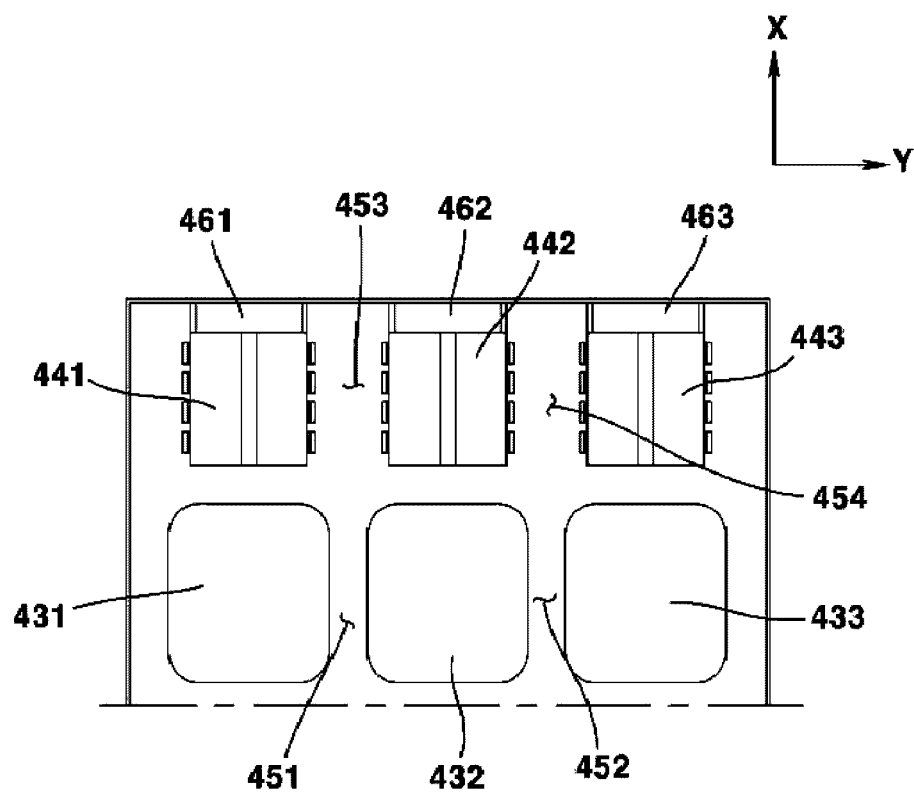
FIG. 14 is a plan view of a heat dissipation structure inside a power conversion device according to a fourth embodiment of the present invention viewed from above.

FIG. 14 is a plan view of a heat dissipation structure inside a power conversion device according to a fourth embodiment of the present invention viewed from above.

The present embodiment is the same as the first embodiment in other parts, but there is a difference in the number of the heat dissipation member and fan. Hereinafter, only the characteristic parts of the present embodiment will be described, and for the remaining parts, the description of the first embodiment will be used.

Referring to FIG. 14, the power conversion device according to the present embodiment may include: a plurality of heat dissipation members 441, 442, and 443; a plurality of first electronic components 431, 432, and 434; and a plurality of fans 461, 462, and 463.

In the present embodiment, the number of the heat dissipation member 440, the first electronic component 430, and the fan 460 may be equally disposed. For example, the heat dissipation member includes a first heat dissipation member 441, a second heat dissipation member 442, and a third heat dissipation member 443; the first electronic component includes a first-first electronic component 431, a first-second electronic component 432, and a first-third electronic component 433; and the fan may include a first fan 461, a second fan 462, and a third fan 463.

The first to three heat dissipation members 441, 442, and 443 may be spaced apart from each other along a second direction Y. A third space portion 453 is formed between the first heat dissipation member 441 and the second heat dissipation member 442, and a fourth space portion 454 may be formed between the second heat dissipation member 442 and the third heat dissipation member 443.

The first-first to first-third electronic components 431, 432, and 433 may be disposed to be spaced apart from each other along a second direction Y. A first space portion 451 is formed between the first-first electronic component 431 and the first-second electronic component 432, and a second space portion 452 may be formed between the first-second electronic component 432 and the first-third electronic component 433.

The first to third fans 461, 462, and 463 may disposed to be spaced apart from each other along a second direction Y.

The first heat dissipation member 441 may be disposed to be overlapped with each of the first-first electronic component 431 and the first fan 461 along a first direction X. The second heat dissipation member 442 may be disposed to be overlapped with each of the first-second electronic component 432 and the second fan 462 along a first direction X. The third heat dissipation member 443 may be disposed to be overlapped with the first-third electronic component 433 and the third fan 463 along a first direction X, respectively. The first space portion 451 may be disposed to be overlapped with the third space portion 453 along a first direction X. The second space portion 452 may be disposed to be overlapped with the fourth space portion 454 along a first direction X.

In the case of such an arrangement, as in the third embodiment, since the air passing through the first space portion 451 and the second space portion 452 passes through the third space portion 453 and the fourth space portion 454 rather than passing through the inside of the heat dissipation member 440, the effect on heat dissipation may be insignificant.

Figure 15:
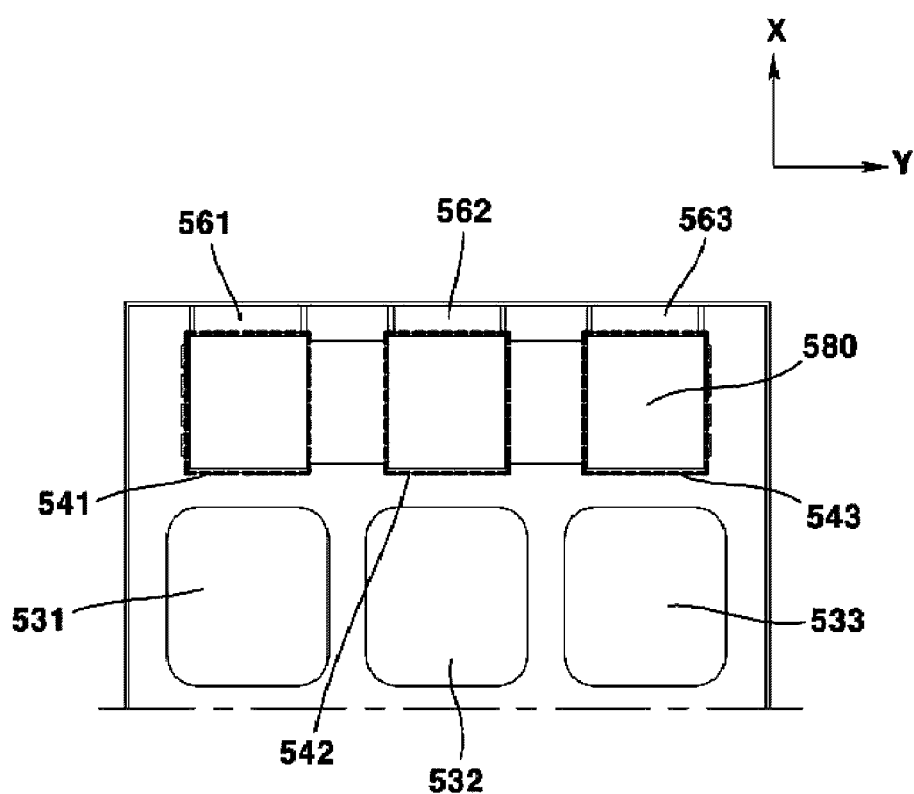
FIG. 15 is a plan view of a heat dissipation structure inside a power conversion device according to a fifth embodiment of the present invention viewed from above.

FIG. 15 is a plan view of a heat dissipation structure inside a power conversion device according to a fifth embodiment of the present invention viewed from above. The present embodiment is the same as the fourth embodiment in other parts, but there is a difference in the heat dissipation plates. Hereinafter, only the characteristic parts of the present embodiment will be described, and for the remaining parts, the description of the fourth embodiment will be used.

Referring to FIG. 15, in the present embodiment, a heat dissipation plate 580 may be disposed on the first to third heat dissipation members 541, 542, and 543. The heat dissipation plate 580 is formed in a plate shape made of a metal material to interconnect the first to third heat dissipation members 541, 542, and 543. A lower surface of the heat dissipation plate 580 may be in contact with upper surfaces of the first to third heat dissipation members 541, 542, and 543.

A second electronic component 122 (see FIG. 6) may be disposed on the heat dissipation plate 580. In the case of such an arrangement, similar to the second embodiment, since a part of the heat of the second electronic component 122 is discharged to a lower surface of a portion of the heat dissipation plate 580 being disposed between the first heat dissipation member 541 and the second heat dissipation member 542, or to a lower surface of a portion of the heat dissipation plate 580 being disposed between the second heat dissipation member 542 and the third heat dissipation member 543, there is an advantage that heat dissipation efficiency can be improved. In addition, since the second electronic components 122 can be disposed in a line through the heat dissipation plate 580, it has the advantage of being able to design freely from space constraints.

Figure 16:
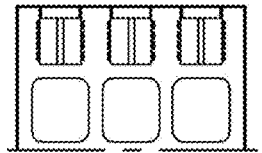
FIG. 16 is a table comparing the temperatures of electronic components with heat dissipation structures according to the fourth and fifth embodiments.
Figure 16:
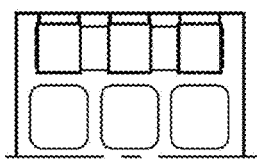

FIG. 16 is a table comparing the temperatures of electronic components with heat dissipation structures according to the fourth and fifth embodiments.

Referring to FIG. 16, it can be confirmed that the heat dissipation performance is excellent in the case of interconnecting a plurality of heat dissipation members through a heat dissipation plate (the fifth embodiment), than in the case of disposing the second electronic component by separating each heat dissipation member (the fourth embodiment).

Figure 17:
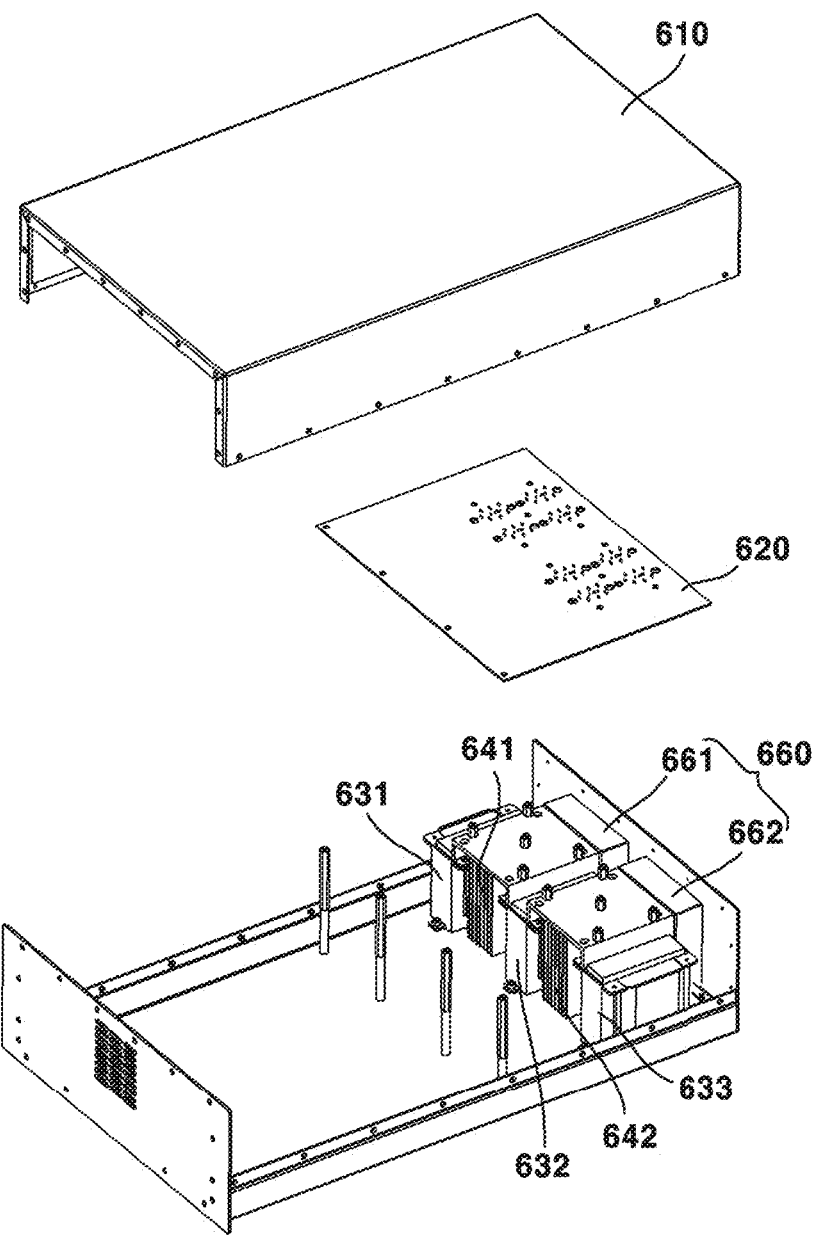
FIG. 17 is an exploded perspective view of a power conversion device according to a sixth embodiment of the present invention.
Figure 18:
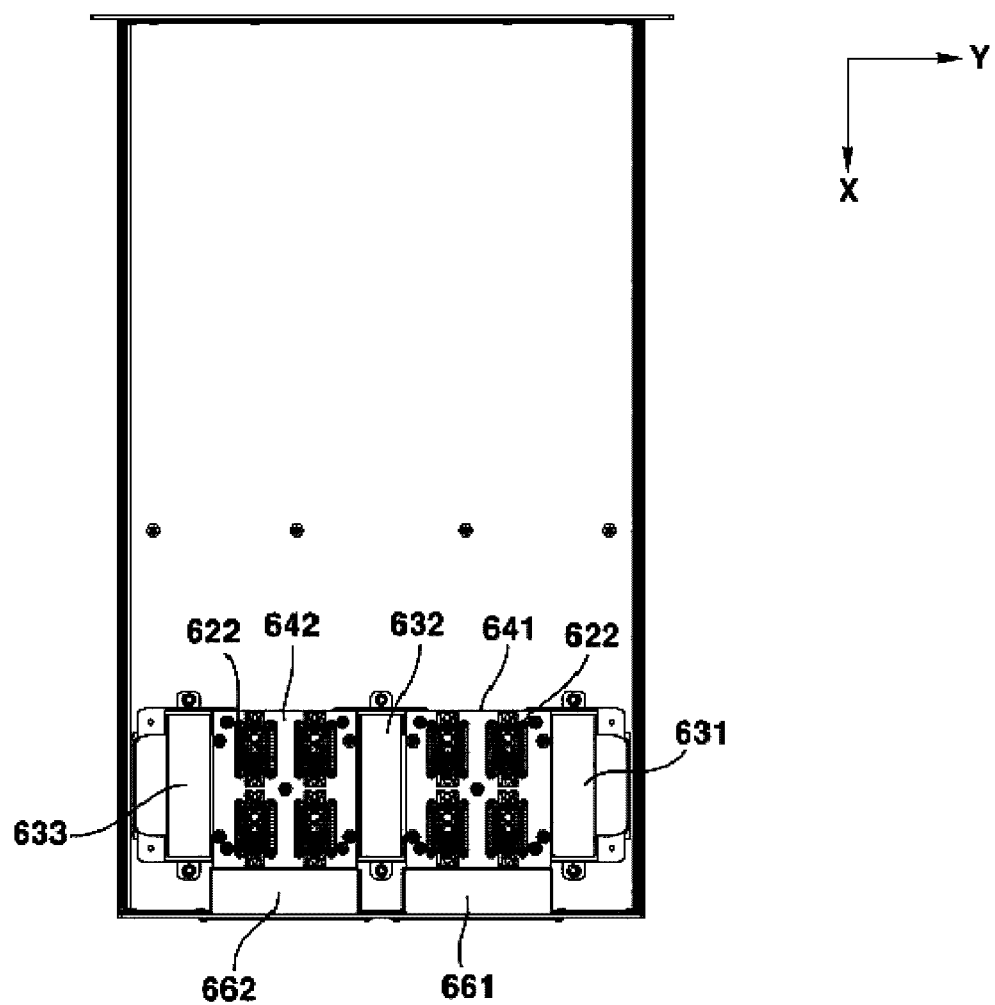
FIG. 18 is a plan view of a heat dissipation structure in a power conversion device according to a sixth embodiment of the present invention viewed from above.

FIG. 17 is an exploded perspective view of a power conversion device according to a sixth embodiment of the present invention; and FIG. 18 is a plan view of a heat dissipation structure in a power conversion device according to a sixth embodiment of the present invention viewed from above.

The present embodiment is the same as the first embodiment in other parts, but there is a difference in the arrangement of the heat dissipation member and the first electronic component. Hereinafter, only the characteristic parts of the present embodiment will be described, and for the remaining parts, the description of the fourth embodiment will be used.

Referring to FIGS. 17 and 18, the power conversion device according to the present embodiment may include a plurality of first electronic components 631, 632, and 633 and a plurality of heat dissipation members 641 and 642. In the present embodiment, the plurality of first electronic components 631, 632, and 633 and the plurality of heat dissipation members 641 and 642 may be disposed along a second direction Y. The plurality of first electronic components 631, 632, and 633 and the plurality of heat dissipation members 641 and 642 may be disposed to be overlapped with each other along a second direction Y.

In detail, the plurality of first electronic components 631, 632, and 633 may include: a first-first electronic component 631; a first-second electronic component 632 being spaced apart from the first-first electronic component 631 in a second direction Y; and a first-third electronic component 633 being spaced apart from the first-second electronic component 632 in a second direction Y.

The heat dissipation member may include: a first heat dissipation member 641 being disposed between a first-first electronic component 631 and a first-second electronic components 632; and a second heat dissipation member 642 disposed between the first-second electronic component 632 and a first-third electronic component 633. Grooves (not shown) in which at least a part of the first-first electronic component 631 and the first-second electronic component 632 are accommodated may be formed on both side surfaces of the first heat dissipation member 641. Grooves (not shown) in which at least a portion of the first-second electronic component 632 and the first-third electronic component 633 are accommodated may be formed on both side surfaces of the second heat dissipation member 642.

The second electronic component 622 is mounted on a lower surface of the printed circuit board 620 so that the lower surface may be in contact with upper surfaces of the heat dissipation members 641 and 642.

The fan 660 may include: a first fan 661 being overlapped with the first heat dissipation member 641 in a first direction X; and a second fan 662 being overlapped with the second heat dissipation member 642 in a first direction X.

According to the above structure, a plurality of electronic components are disposed in a region in which a portion of a plurality of heat dissipation members is removed and compactly disposed between inner surfaces of the housing, so that it has the advantage of securing a wider space in the housing.

In the above description, it is described that all the components constituting the embodiments of the present invention are combined or operated in one, but the present invention is not necessarily limited to these embodiments. In other words, within the scope of the present invention, all of the components may be selectively operated in combination with one or more. In addition, the terms "comprise", "include" or "having" described above mean that the corresponding component may be inherent unless specifically stated otherwise, and thus it should be construed that it does not exclude other components, but further include other components instead. All terms, including technical and scientific terms, have the same meaning as commonly understood by one of ordinary skill in the art unless otherwise defined. Terms used generally, such as terms defined in a dictionary, should be interpreted to coincide with the contextual meaning of the related art, and shall not be interpreted in an ideal or excessively formal sense unless explicitly defined in the present invention.

The above description is merely illustrative of the technical idea of the present invention, and those skilled in the art to which the present invention pertains may make various modifications and changes without departing from the essential characteristics of the present invention. Therefore, the embodiments disclosed in the present invention are not intended to limit the technical idea of the present invention but to describe the present invention, and the scope of the technical idea of the present invention is not limited by these embodiments. The protection scope of the present invention should be interpreted by the following claims, and all technical ideas within the equivalent scope should be interpreted as being included in the scope of the present invention.

The invention claimed is:

1. A power conversion device comprising:
  a housing having a space formed therein and including a first opening and a second opening;

a fan being coupled to the second opening and allowing air to flow in a first direction from the first opening toward the second opening;

a first electronic component being disposed in the space;

a heat dissipation member being disposed between the first electronic component and the fan;

a printed circuit board being disposed at an upper portion of the heat dissipation member; and a second electronic component being disposed at a lower portion of the printed circuit board to be in contact with an upper surface of the heat dissipation member, wherein based on the first direction, the heat dissipation member and the second electronic component are disposed behind the first electronic component.

2. The power conversion device according to claim 1, wherein the first electronic component is provided in plurality and disposed to be spaced apart from each other along a second direction perpendicular to the first direction, and wherein the heat dissipation member is provided in plurality and disposed to be spaced apart from each other along the second direction.

3. The power conversion device according to claim 2, wherein each of the plurality of heat dissipation members is disposed to be overlapped with a region between the plurality of first electronic components in the first direction.

4. The power conversion device according to claim 3, wherein the first electronic component includes a first-first electronic component and a first-second electronic component being spaced apart from each other with respect to a first space portion and a first-third electronic component being spaced apart through the first-first electronic component and a second space portion, and wherein the heat dissipation member includes a first heat dissipation member being disposed to be overlapped with the first space portion in the first direction and a second heat dissipation member being disposed to be overlapped with the second space portion in the first direction.

5. The power conversion device according to claim 4, wherein the fan includes a first fan being disposed to be overlapped with the first heat dissipation member in a first direction and a second fan being disposed to be overlapped with the second heat dissipation member in a first direction.

6. The power conversion device according to claim 1, wherein the heat dissipation member includes a plurality of fins, and wherein a flow path through which air flows is formed between the plurality of fins.

7. The power conversion device according to claim 2, including a heat dissipation plate being disposed on the plurality of heat dissipation members, wherein the second electronic component is provided in plural and being disposed to be spaced apart along the second direction on the heat dissipation plate.

8. The power conversion device according to claim 1, wherein the plurality of heat dissipation members is disposed to be overlapped with the plurality of first electronic components in a first direction.

9. The power conversion device according to claim 2, wherein the plurality of heat dissipation members and the number of the plurality of first electronic components correspond to each other, wherein the fan is provided in plurality, and wherein the number of the plurality of fans corresponds to the number of the plurality of heat dissipation members.

10. The power conversion device according to claim 1, wherein the first electronic component is disposed on an upper surface of a base, and wherein a plurality of heat dissipation fins are formed on the lower surface of the base.

11. The power conversion device according to claim 10, wherein a support part is coupled to an upper surface of the base and a lower surface of the printed circuit board.

12. The power conversion device according to claim 1, wherein based on the first direction, the first electronic component is closer to the second opening than to the first opening.

13. The power conversion device according to claim 7, wherein the first electronic component is provided in plurality, and wherein a length of the heat dissipation plate in the second direction is smaller than a sum of lengths of the plurality of first electronic components in the second direction.

14. The power conversion device according to claim 2, wherein the fan is provided in plurality, and wherein each of the plurality of fans is disposed to overlap a region between the plurality of first electronic components in the first direction.

15. The power conversion device according to claim 1, wherein the fan is disposed to protrude inward from an inner surface of the housing, and wherein the fan and the heat dissipation member are spaced apart from each other in the first direction.

16. A power conversion device comprising:

a housing having a first opening and a second opening;

a fan being coupled to the second opening and allowing air to flow in a first direction from the first opening toward the second opening;

a first electronic component being disposed in the housing;

a heat dissipation member being disposed between the first electronic component and the fan; and a second electronic component disposed on the heat dissipation member, wherein the first electronic component is provided in plurality and disposed to be spaced apart from each other along a second direction perpendicular to the first direction, wherein the heat dissipation member is provided in plurality and disposed to be spaced apart from each other along the second direction, and wherein each of the plurality of heat dissipation members is disposed to be overlapped with a region between the plurality of first electronic components in the first direction.

17. The power conversion device according to claim 16, wherein the first electronic component includes a first-first electronic component and a first-second electronic component being spaced apart from each other with respect to a first space portion and a first-third electronic component being spaced apart through the first-first electronic component and a second space portion, and wherein the heat dissipation member includes a first heat dissipation member being disposed to be overlapped with the first space portion in the first direction and a second heat dissipation member being disposed to be overlapped with the second space portion in the first direction.

18. The power conversion device according to claim 17, wherein the fan includes a first fan being disposed to be overlapped with the first heat dissipation member in a first direction and a second fan being disposed to be overlapped with the second heat dissipation member in a first direction.

19. The power conversion device according to claim 16, including a heat dissipation plate being disposed on the plurality of heat dissipation members,
- wherein the second electronic component is provided in plural and being disposed to be spaced apart along the second direction on the heat dissipation plate.

20. A power conversion device comprising:
- a housing having a space formed therein and including a first opening and a second opening;
- a fan being coupled to the second opening and allowing air to flow in a first direction from the first opening toward the second opening;
- a plurality of first electronic components being disposed in the space;
- a heat dissipation member being disposed between the plurality of first electronic components;
- a printed circuit board being disposed at an upper portion of the heat dissipation member and the first electronic components; and
- a second electronic component being disposed at a lower portion of the printed circuit board to be in contact with an upper surface of the heat dissipation member,
- wherein the first electronic component and the heat dissipation member are disposed to be overlapped with each other in a second direction perpendicular to the first direction.

* * * * *